(12) United States Patent
Park et al.

(10) Patent No.: US 12,334,262 B2
(45) Date of Patent: *Jun. 17, 2025

(54) MULTILAYER CERAMIC CAPACITOR AND BOARD HAVING THE SAME

(71) Applicant: SAMSUNG ELECTRO-MECHANICS CO., LTD., Suwon-si (KR)

(72) Inventors: Moon Soo Park, Suwon-si (KR); Jae Hun Choe, Suwon-si (KR); Dong Hun Kim, Suwon-si (KR); Byung Chul Jang, Suwon-si (KR); Chang Hak Choi, Suwon-si (KR); Byung Kun Kim, Suwon-si (KR)

(73) Assignee: SAMSUNG ELECTRO-MECHANICS CO., LTD, Suwon-si (KR)

( * ) Notice: Subject to any disclaimer, the term of this patent is extended or adjusted under 35 U.S.C. 154(b) by 287 days.

This patent is subject to a terminal disclaimer.

(21) Appl. No.: 18/085,847

(22) Filed: Dec. 21, 2022

(65) Prior Publication Data

US 2023/0119994 A1 Apr. 20, 2023

Related U.S. Application Data

(63) Continuation of application No. 17/342,844, filed on Jun. 9, 2021, now Pat. No. 11,569,033, which is a
(Continued)

(30) Foreign Application Priority Data

Apr. 13, 2017 (KR) ........................ 10-2017-0048049
Jun. 8, 2017 (KR) ........................ 10-2017-0071512

(51) Int. Cl.
*H01G 4/012* (2006.01)
*H01G 4/12* (2006.01)
(Continued)

(52) U.S. Cl.
CPC ............... *H01G 4/012* (2013.01); *H01G 4/12* (2013.01); *H01G 4/232* (2013.01); *H01G 4/30* (2013.01);
(Continued)

(58) Field of Classification Search
None
See application file for complete search history.

(56) References Cited

U.S. PATENT DOCUMENTS

| 4,701,827 A | 10/1987 | Fujikawa |
| 6,475,317 B1 | 11/2002 | Baba et al. |

(Continued)

FOREIGN PATENT DOCUMENTS

| CN | 1794388 A | 6/2006 |
| CN | 103177872 A | 6/2013 |

(Continued)

OTHER PUBLICATIONS

Japanese Office Action dated Jul. 25, 2023, issued in corresponding Japanese Patent Application No. 2022-120769.
(Continued)

*Primary Examiner* — Eric W Thomas
(74) *Attorney, Agent, or Firm* — Morgan, Lewis & Bockius LLP

(57) ABSTRACT

A multilayer ceramic capacitor (MLCC) includes a body including first dielectric layers and second dielectric layers, the body including first to sixth surfaces, a second surface, a third surface, a fourth surface, a fifth surface and a sixth surface; first internal electrodes disposed on the first dielectric layers, exposed to the third surface, the fifth surface, and the sixth surface, and spaced apart from the fourth surface by first spaces; second internal electrodes disposed on the second dielectric layers to oppose the first internal electrodes with the first dielectric layers or the second dielectric layers
(Continued)

interposed therebetween, exposed to the fourth surface, the fifth surface, and the sixth surface, and spaced apart from the third surface by second spaces; first dielectric patterns disposed in at least a portion of the first spaces, and second dielectric patterns disposed in at least a portion of the second spaces; and lateral insulating layers.

18 Claims, 9 Drawing Sheets

Related U.S. Application Data continuation of application No. 16/536,520, filed on Aug. 9, 2019, now Pat. No. 11,062,845, which is a continuation of application No. 16/299,736, filed on Mar. 12, 2019, now Pat. No. 10,522,285, which is a continuation of application No. 15/805,781, filed on Nov. 7, 2017, now Pat. No. 10,475,574.

(51) Int. Cl.
*H01G 4/232* (2006.01)
*H01G 4/30* (2006.01)
*H05K 1/02* (2006.01)
*H05K 1/03* (2006.01)
*H05K 1/11* (2006.01)
*H05K 1/18* (2006.01)

(52) U.S. Cl.
CPC ......... *H01G 4/2325* (2013.01); *H05K 1/0231* (2013.01); *H05K 1/0306* (2013.01); *H05K 1/111* (2013.01); *H05K 1/181* (2013.01)

(56) References Cited

U.S. PATENT DOCUMENTS

| | | | |
|---|---|---|---|
| 7,251,119 B2 | 7/2007 | Kim et al. | |
| 8,587,920 B2 | 11/2013 | Lee et al. | |
| 10,475,574 B2* | 11/2019 | Park | H01G 4/232 |
| 10,522,285 B2* | 12/2019 | Park | H01G 4/012 |
| 11,062,845 B2* | 7/2021 | Park | H01G 4/12 |
| 11,569,033 B2* | 1/2023 | Park | H01G 4/30 |
| 2006/0139848 A1 | 6/2006 | Kim et al. | |
| 2006/0214263 A1 | 9/2006 | Kojima et al. | |
| 2010/0025075 A1 | 2/2010 | Feichtinger et al. | |
| 2012/0140377 A1 | 6/2012 | Kim et al. | |
| 2012/0147516 A1 | 6/2012 | Kim et al. | |
| 2013/0141837 A1 | 6/2013 | Lee et al. | |
| 2013/0163143 A1 | 6/2013 | Lee et al. | |
| 2013/0190163 A1 | 7/2013 | Sakurai et al. | |
| 2014/0153154 A1 | 6/2014 | Choi et al. | |
| 2015/0114700 A1 | 4/2015 | Park et al. | |
| 2015/0325781 A1 | 11/2015 | Rinner et al. | |
| 2016/0240317 A1 | 8/2016 | Ro et al. | |
| 2017/0076865 A1 | 3/2017 | Tanaka et al. | |
| 2017/0076867 A1 | 3/2017 | Okai et al. | |
| 2017/0154733 A1 | 6/2017 | Lee et al. | |

FOREIGN PATENT DOCUMENTS

| | | |
|---|---|---|
| CN | 104576048 A | 4/2015 |
| CN | 105023750 A | 11/2015 |
| CN | 106816312 A | 6/2017 |
| JP | H08-097070 A | 4/1996 |
| JP | 9-115766 A | 5/1997 |
| JP | 11-54365 A | 2/1999 |
| JP | 2000-311831 A | 11/2000 |
| JP | 2001-126951 A | 5/2001 |
| JP | 2004-096010 A | 3/2004 |
| JP | 2004-152909 A | 5/2004 |
| JP | 2004-345873 A | 12/2004 |
| JP | 2006-179873 A | 7/2006 |
| JP | 2008-091400 A | 4/2008 |
| JP | 2010-518651 A | 5/2010 |
| JP | 2013-166687 A | 8/2013 |
| JP | 2015-159140 A | 9/2015 |
| JP | 2016-134462 A | 7/2016 |
| JP | 2017-059635 A | 3/2017 |
| JP | 2017-059820 A | 3/2017 |
| KR | 10-2005-0075903 | 7/2005 |
| KR | 10-2006-0103834 A | 10/2006 |
| KR | 10-1141457 B1 | 5/2012 |
| KR | 10-2012-0062238 A | 6/2012 |
| KR | 10-2013-0063234 | 6/2013 |
| KR | 10-2014-0071724 A | 6/2014 |
| KR | 10-2016-0100701 A | 8/2016 |

OTHER PUBLICATIONS

U.S. Non-Final Office Action dated Nov. 2, 2018 issued in U.S. Appl. No. 15/805,781.
Office Action issued in Korean Patent Application No. 10-2017-0071512, dated Jun. 4, 2018 (with English translation).
Korean Decision to Grant A Patent dated Dec. 11, 2018 issued in Korean Patent Application No. 10-2017-0071512 (with English translation).
Korean Decision to Grant A Patent dated Oct. 19, 2018 issued in Korean Patent Application No. 10-2017-0071512 (with English translation).
Office Action issued in corresponding U.S. Appl. No. 15/805,781, dated Mar. 27, 2019.
Office Action issued in corresponding U.S. Appl. No. 16/299,736, dated May 9, 2019.
Notice of Allowance issued in corresponding U.S. Appl. No. 15/805,781, dated Jul. 10, 2019.
Chinese Office Action dated Jan. 27, 2021 issued in Chinese Patent Application No. 201910981832.9.
U.S. Final Office Action dated Nov. 30, 2020 issued in U.S. Appl. No. 16/536,520.
U.S. Non-Final Office Action dated Jul. 6, 2020 issued in U.S. Appl. No. 16/536,520.
Japanese Office Action dated Jan. 21, 2020 issued in Japanese Patent No. 2017-214632 (with English translation).
U.S. Non-Final Office Action dated Jan. 14, 2020 issued in U.S. Appl. No. 16/536,520.
U.S. Non-Final Office Action dated Oct. 3, 2019 issued in U.S. Appl. No. 16/536,520.
Japanese Office Action dated Nov. 2, 2021 issued in Japanese Patent Application No. 2020-186777 (with English translation).

* cited by examiner

I-I'

II-II'

MULTILAYER CERAMIC CAPACITOR AND BOARD HAVING THE SAME

CROSS-REFERENCE TO RELATED APPLICATIONS

This application is the continuation application of U.S. patent application Ser. No. 17/342,844 filed on Jun. 9, 2021, which is a continuation of U.S. patent application Ser. No. 16/536,520, filed Aug. 9, 2019, now U.S. patent Ser. No. 11/062,845, issued on Jul. 13, 2011, which is a continuation of U.S. patent application Ser. No. 16/299,736, filed Mar. 12, 2019, now U.S. Pat. No. 10,522,285, issued on Dec. 31, 2019, which is a continuation application of Ser. No. 15/805, 781, filed Nov. 7, 2017, now U.S. patent Ser. No. 10/475, 574, issued on Nov. 12, 2019, which claims the benefit of priority to Korean Patent Application Nos. 10-2017-0048049 filed on Apr. 13, 2017 and 10-2017-0071512 filed on Jun. 8, 2017, the entireties of each of which are incorporated herein by reference.

TECHNICAL FIELD

The present disclosure relates to a multilayer ceramic capacitor and a board having the same.

BACKGROUND

Capacitors are devices able to store electricity. When a voltage is applied to two opposing electrodes of a capacitor, the respective electrodes of the capacitor are charged with electricity. When a direct current (DC) voltage is applied to the electrodes of the capacitor, DC current flows into the capacitor while electricity is stored therein. However, when electricity storage is completed, the DC current no longer flows thereinto. In contrast, when an alternating current (AC) voltage is applied to the electrodes, AC current continues to flow into the capacitor while the polarities of the electrodes alternate with each other.

According to types of insulators provided between the electrodes, such capacitors may be divided into various types: an aluminum electrolytic capacitor having electrodes formed of aluminum and having a thin oxide layer between the electrodes; a tantalum capacitor using tantalum as an electrode material; a ceramic capacitor using a high-k dielectric, such as titanium barium, between electrodes; a multilayer ceramic capacitor (MLCC) provided as a dielectric between electrodes using a high-k-based ceramic as a multilayer structure; and a film capacitor using a polystyrene film provided as a dielectric between electrodes.

Among these capacitors, the MLCC may have excellent temperature and frequency characteristics and may be implemented to have a compact size to thus be applied for use in various fields, such as high-frequency circuits.

MLCCs, according to the related art, have a laminate formed by stacking a plurality of dielectric sheets, external electrodes formed on external surfaces of the laminate to have different polarities, and internal electrodes alternately stacked inside the laminate to be electrically connected to the external electrodes, respectively.

In recent years, with electronic products being formed to have a compact size and high integration, a lot of research into the implementation of compact size and high integration in MLCCs has been conducted. In particular, in the case of MLCCs, various attempts have been made to improve the connectivity of internal electrodes while thinning and highly stacking dielectric layers, in order to achieve high capacity and compact size in MLCCs.

Especially, it has become more important to ensure the reliability of products in which thin-film dielectric layers and internal electrodes are highly stacked. As the stacking number of dielectric layers and internal electrodes is increased, there may be an increase in an amount of step portions formed due to a difference in thicknesses between one portion, such as a central portion of the MLCC, in which the internal electrodes and the dielectric layers are stacked, and another portion, such as an edge portion (or margin portion), in which some of the internal electrodes formed in the one portion may not be formed. Such step portions may cause the end portions of internal electrodes to be bent, owing to the transverse elongation of dielectric layers, in a densification process of pressing MLCC bodies.

That is, the end portions of internal electrodes may be curved when some portions of the dielectric layers reposition to fill the step portions, and margin portions may remove empty space, formed by the step portion, by the depression of covers and a reduction in the margin width. Capacity layers may also be elongated by the margin width reduced by removing the empty space in the margin. Such structurally irregular elongation of internal electrodes may reduce the characteristics of MLCCs, such as breakdown voltage (BDV) characteristics.

The occurrence of the step portion, as described above, may be a problem both in a first direction, perpendicular to the stacking direction of the internal electrodes and the dielectric layers of the MLCCs, and in a second direction, perpendicular to the first direction and perpendicular to the stacking direction. Thus, a need exists for a solution to solve this problem.

SUMMARY

An aspect of the present disclosure may provide a multilayer ceramic capacitor (MLCC) having a structure capable of addressing the issue of a step portion formed by a difference in thicknesses between different portions of a laminate including a dielectric layer and an internal electrode.

According to an aspect of the present disclosure, a multilayer ceramic capacitor (MLCC) may include: a body including first dielectric layers and second dielectric layers, the body including a first surface and a second surface opposing each other in a stacking direction along which the first and second dielectric layers are stacked, a third surface and a fourth surface connected to the first surface and the second surface and opposing each other, and a fifth surface and a sixth surface connected to the first surface, the second surface, the third surface, and the fourth surface and opposing each other; first internal electrodes disposed on the first dielectric layers, exposed to the third surface, the fifth surface, and the sixth surface, and spaced apart from the fourth surface by first spaces; second internal electrodes disposed on the second dielectric layers to oppose the first internal electrodes with the first dielectric layers or the second dielectric layers interposed therebetween, exposed to the fourth surface, the fifth surface, and the sixth surface, and spaced apart from the third surface by second spaces; first dielectric patterns disposed in at least a portion of the first spaces, and second dielectric patterns disposed in at least a portion of the second spaces; and lateral insulating layers disposed on the fifth surface and the sixth surface of the body.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
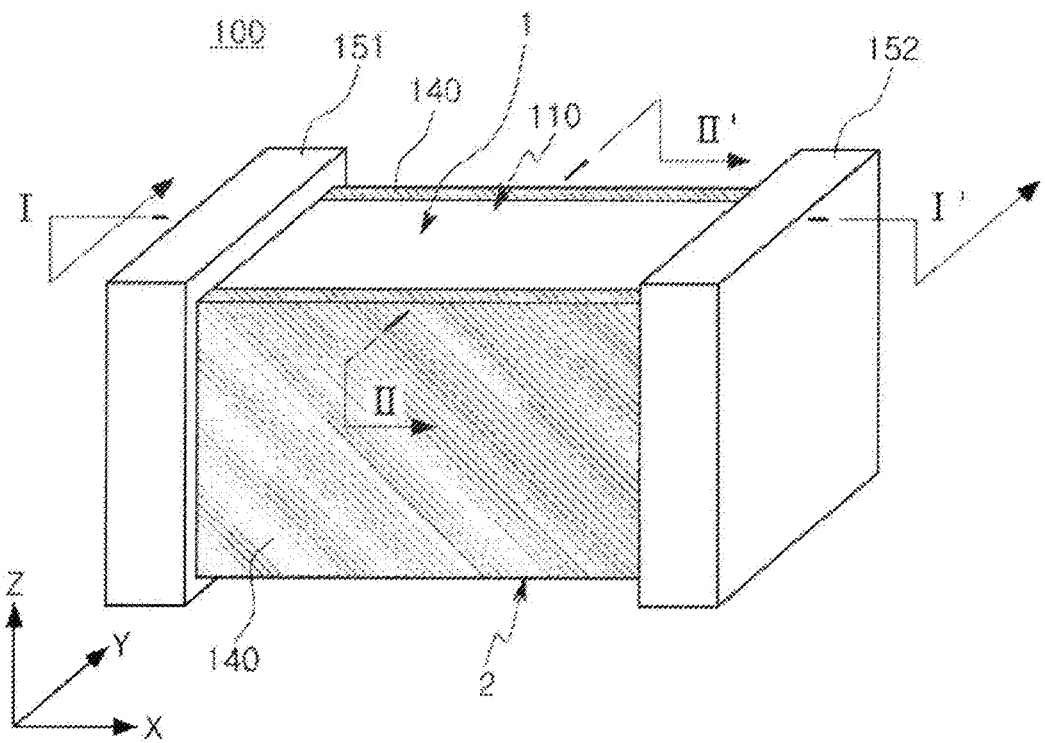
FIG. 1 illustrates a schematic perspective view of a multilayer ceramic capacitor (MLCC) according to an exemplary embodiment.

Hereinafter, embodiments of the present disclosure will be described with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated, listed items.

It will be apparent that, although the terms 'first,' 'second,' 'third,' etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" or the like, may be used herein for ease of description to describe one element's relationship relative to another element(s), as shown in the figures. It will be understood that spatially relative terms are intended to encompass different orientations of the device in use or operation, in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations, depending on a particular directional orientation of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted alone or as a combination of several or all thereof.

The contents of the present disclosure described below may have a variety of configurations, and only a required configuration is proposed herein, but the present disclosure is not limited thereto.

Multilayer Ceramic Capacitor (MLCC)

Figure 2:
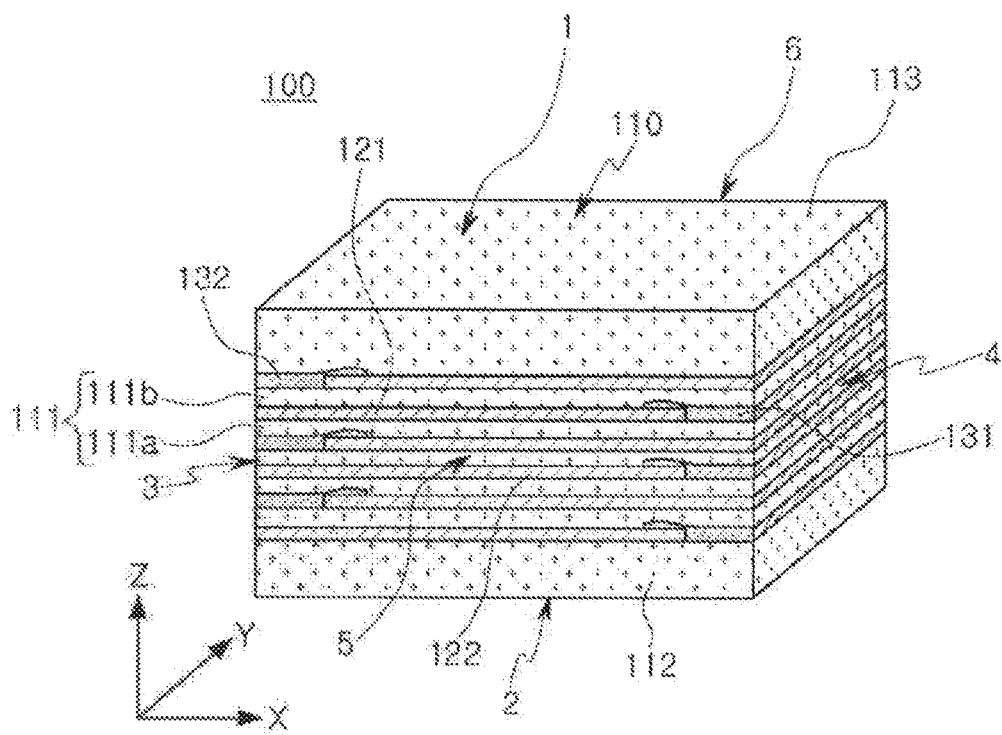
FIG. 2 illustrates a schematic perspective view of a body of an MLCC according to an exemplary embodiment.
Figure 3:
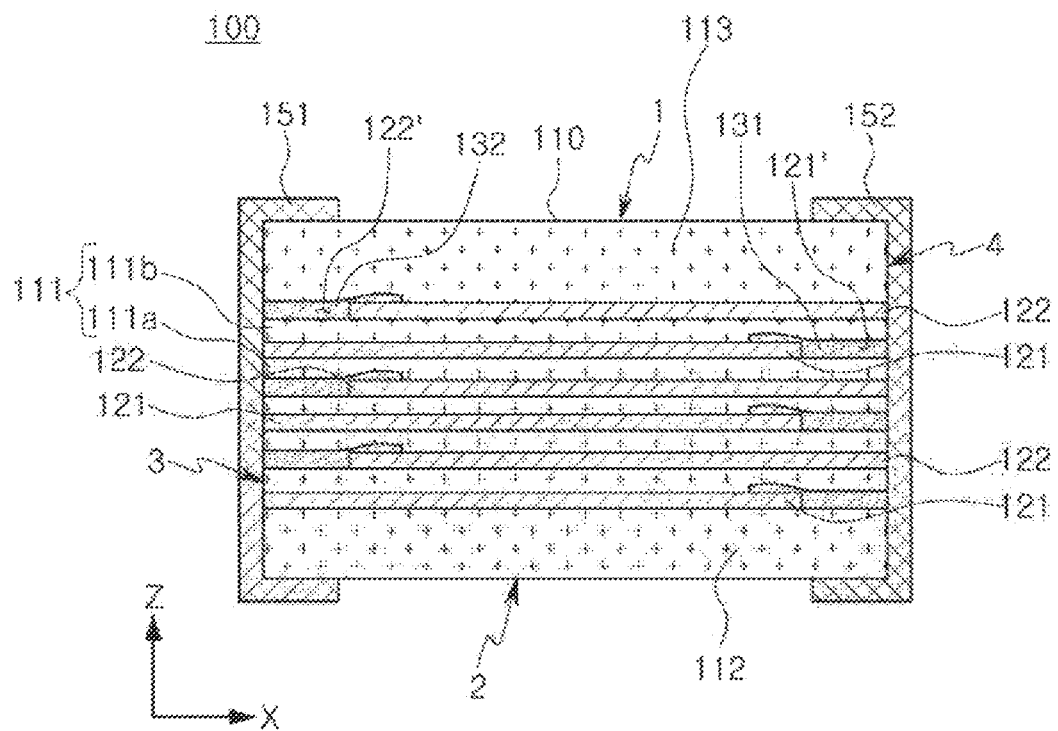
FIG. 3 illustrates a schematic cross-sectional view taken along line I-I' of FIG. 1.
Figure 4:
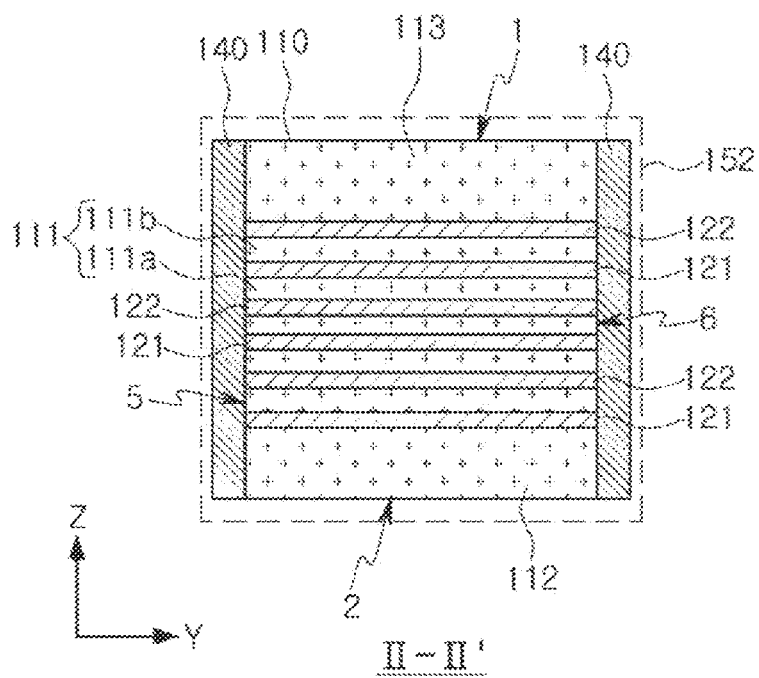
FIG. 4 illustrates a schematic cross-sectional view taken along line II-II' of FIG. 1.

FIG. 1 illustrates a schematic cross-sectional view of an MLCC 100 according to an exemplary embodiment, and FIG. 2 illustrates a schematic perspective view of a body 110 of the MLCC 100 according to an exemplary embodiment. FIG. 3 illustrates a schematic cross-sectional view taken along line I-I' of FIG. 1, and FIG. 4 illustrates a schematic cross-sectional view taken along line II-II' of FIG. 1.

Referring to FIGS. 1 through 4, the MLCC 100 according to an exemplary embodiment will be described hereinafter.

The MLCC 100, according to the exemplary embodiment, may include the body 110 having a plurality of first and second dielectric layers 111a and 111b stacked therein, a first external electrode 151, and a second external electrode 152.

The body 110 may be formed by stacking the first and second dielectric layers 111a and 111b in a thickness direction thereof and firing the stacked first and second dielectric layers 111a and 111b. The number of the first and second dielectric layers 111a and 111b may be adjusted appropriately. For example, tens to hundreds of first and second dielectric layers 111a and 111b, on each of which one internal electrode is disposed, may be stacked. The respective first and second dielectric layers 111a and 111b, adjacent to each other, of the body 110 may be integrated to the extent that boundaries between the first and second dielectric layers 111a and 111b are difficult to identify. In addition, the body 110 may have a hexahedral shape, but the shape of the body 110 is not limited thereto.

When the body 110 has the hexahedral shape, the body 110 may include a first surface 1 and a second surface 2 opposing each other, a third surface 3 and a fourth surface 4 connected to the first surface 1 and the second surface 2 and opposing each other, and a fifth surface 5 and a sixth surface 6 connected to the first surface 1, the second surface 2, the third surface 3, and the fourth surface 4 and opposing each other.

In an exemplary embodiment, the stacking direction may be referred to as a thickness direction or a first direction Z, a direction, in which the third surface 3 and the fourth surface 4 are formed, may be referred to as a length direction or a second direction X, and a direction, in which the fifth surface 5 and the sixth surface 6 are formed, may be referred to as a width direction or a third direction Y.

The body 110 may have upper and lower cover layers 113 and 112 formed on an upper surface of an uppermost internal electrode and a lower surface of a lowermost internal electrode to have a certain thickness. The upper cover layer 113 and the lower cover layer 112 may include the same composition as the first and second dielectric layers 111a and 111b, and may be formed by stacking at least one dielectric layer, having no internal electrode, on each of the upper surface of the uppermost internal electrode and the lower surface of the lowermost internal electrode.

The first and second dielectric layers 111a and 111b may include a high-k ceramic material, for example, a barium titanate ($BaTiO_3$)-based ceramic powder or the like, but the present disclosure is not limited thereto. Examples of the $BaTiO_3$-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$, in which calcium (Ca), zirconium (Zr), or the like is partially dissolved in $BaTiO_3$, but the present disclosure is not limited thereto. In addition, the first and second dielectric layers 111a and 111b may further include at least one of a ceramic additive, an organic solvent, a plasticizer, a binder, and a dispersant. Examples of the ceramic additive may include a transition metal oxide or carbide, a rare earth element, or magnesium (Mg) or aluminum (Al).

The first dielectric layers 111a may have first internal electrodes 121 disposed thereon. The first internal electrodes 121 may be disposed on the first dielectric layers 111a so as to be exposed to the third surface 3, the fifth surface 5, and the sixth surface 6 of the body 110. The first internal electrodes 121 may not be exposed to the fourth surface 4 of the body 110. The first internal electrodes 121 may be spaced apart from the fourth surface 4 by a certain distance. A space by which each of the first internal electrodes 121 is spaced apart from the fourth surface 4 may be defined as a first space 121'.

The second dielectric layers 111b may have second internal electrodes 122 disposed thereon. The second internal electrodes 122 may be disposed on the second dielectric layers 111b so as to be exposed to the fourth surface 4, the fifth surface 5, and the sixth surface 6 of the body 110. The first internal electrodes 121 may not be exposed to the third surface 3 of the body 110. The second internal electrodes 122 may be spaced apart from the third surface 3 by a certain distance. A space by which each of the second internal electrodes 122 is spaced apart from the third surface 3 may be defined as a second space 122'.

The first and second internal electrodes 121 and 122 may be formed and stacked on a ceramic sheet for forming the first dielectric layers 111a and the second dielectric layers 111b, and may then be alternately disposed inside the body 110 in the thickness direction by being sintered with at least one of the first and second dielectric layers 111a and 111b interposed therebetween.

The first and second internal electrodes 121 and 122, having different polarities, may oppose each other in a direction in which the first and second dielectric layers 111a and 111b are stacked, and may be electrically insulated from each other by the first and second dielectric layers 111a and 111b disposed therebetween.

When an internal electrode is exposed externally of a body, short circuits may occur owing to the infiltration of conductive foreign substances into the body, and reliability of the MLCC may thus be reduced. As a result, when the internal electrode was formed on a dielectric layer in the related art, the dielectric layer was formed to have an area wider than that of the internal electrode, and a margin portion was thus formed in a remaining portion of the dielectric layer, except for a portion of the internal electrode connected to an external electrode. For example, the margin portion may refer to an area of a dielectric in which the internal electrode is not formed. When the internal electrode is formed on the dielectric layer in a manufacturing process of an MLCC, the internal electrode may have such a shape in which the internal electrode protrudes in a stacking direction from the margin portion. The shape may result in a step portion, and when tens to hundreds of dielectric layers are stacked, each of the dielectric layers may be elongated and bent to fill the step portion. When the dielectric layer is elongated, the internal electrode may also be bent together. When the internal electrode is curved or bent, BDV characteristics may deteriorate in a curved or bent portion thereof.

Thus, the MLCC, according to an exemplary embodiment, may prevent step portions in the width direction caused by the internal electrodes not forming in the margin portions during manufacturing, by removing the margin portions to form the fifth surface 5 and the sixth surface 6 of the body 110 to expose the first and second internal electrodes 121 and 122. As a result, reliability of the MLCC may be increased by preventing BDV characteristics from deteriorating through avoiding the internal electrode from being bent in the width direction.

The first internal electrodes 121 and the second internal electrodes 122 may be exposed to the third surface 3 and the fourth surface 4, respectively, to be led therefrom. Thereafter, the first external electrode 151 may be exposed to the third surface 3 and the second external electrode 152 may be exposed the fourth surface 4, and thus the first internal electrodes 121 and the second internal electrodes 122 may be respectively protected by the first external electrode 151 and the second external electrode 152 without being exposed externally.

However, substantially all of the first internal electrodes 121 and the second internal electrodes 122 may be exposed to the fifth surface 5 and the sixth surface 6, and thus the first and second internal electrodes 121 and 122 may be protected by arranging additional lateral insulating layers 140 on the fifth surface 5 and the sixth surface 6.

The body 110 may be dipped into slurry, including ceramic, to form the lateral insulating layers 140. The slurry may include a ceramic powder, an organic binder, or an organic solvent. The ceramic powder may include a high-k material, and a material, having excellent heat resistance and durability and a wide activating range, may be used as the ceramic powder when forming the lateral insulating layers 140.

The type of the ceramic powder is not limited thereto. Examples of the ceramic powder may include a barium titanate-based material, a lead-composite perovskite material, or a strontium titanate-based material, preferably a barium titanate powder.

The organic binder may be used to ensure dispersibility of the ceramic powder inside the slurry, but the purpose of the organic binder is not limited thereto. Examples of the organic binder may include ethylcellulose, polyvinylbutyral, or a mixture thereof.

When the body 110 is dipped into the slurry manufactured as described above, a surface of the body 110 contacting the slurry may be coated with the slurry to form the lateral insulating layers 140. Repetition of dipping and drying the body 110 may allow the body 110 to be coated with a desired amount of slurry to form the body 110 having a required thickness.

When the body 110 is dipped into the slurry, the third surface 3 and the fourth surface 4 of the body 110 may be prevented from being coated with the slurry to form the first external electrode 151 and the second external electrode 152 on the third surface 3 and the fourth surface 4. Thus, the third surface 3 and the fourth surface 4 may have a film attached thereto and may then be dipped into the slurry, so as not to be contaminated by the slurry, but the protection manner of the third surface 3 and the fourth surface 4 in the dipping is not limited thereto. For example, a ceramic bar, which may be divided into a plurality of bodies 110 by cutting to form respective third surfaces 3 and fourth surfaces 4, may be dipped in the slurry before cutting to form the respective third surfaces 3 and the fourth surfaces 4 of the plurality of bodies to allow side surfaces of the ceramic bar corresponding to respective fifth surfaces 5 and respective sixth surfaces 6 of the plurality of bodies 110 to be coated with the slurry. After the side surfaces of the ceramic bar corresponding to the respective fifth surfaces 5 and the respective sixth surfaces 6 of the plurality of bodies 110 are coated with the slurry, a cutting process may be performed to divide the ceramic bar to the plurality of bodies 110.

By arranging the lateral insulating layers 140 on the fifth surface 5 and the sixth surface 6, the conductive foreign substances may be prevented from flowing into the first and second internal electrodes 121 and 122 exposed to the fifth surface 5 and the sixth surface 6.

Further, the lateral insulating layers 140 may be formed using polymer. For example, the lateral insulating layers 140 may be formed by coating lateral surfaces of the body 110 with epoxy.

In particular, the MLCC 100, according to an exemplary embodiment, may ensure a significantly increased effective capacity area through removal of the margin portions in the width direction to form the fifth surface 5 and the sixth surface 6, which the first and second internal electrodes 121 and 122 may be exposed to, thus further increasing capacity of the MLCC. For example, the MLCC 100, according to an exemplary embodiment, may increase a volume in which capacity thereof may be implemented by arranging the lateral insulating layers 140 able to prevent the infiltration of the conductive foreign substances into the body, while having a thickness relatively reduced as compared to that of the margin portions, on the fifth surface 5 and the sixth surface 6 of the body 110, in lieu of the margin portions.

However, a step portion may be formed in the length direction in which the internal electrode is connected to the external electrode, similarly to the step portion formed by the margin portion in the width direction. For example, even when the step portion in the width direction is prevented from being formed in the margin portion, for example, by removing the margin portion, the step portion formed in the length direction may cause BDV characteristics of the MLCC to fail to reach a target value.

The first and second internal electrodes 121 and 122 may alternately be exposed to the third surface 3 and the fourth surface 4, both end surfaces of the body 110 in the length direction, respectively, to be connected to the first and second external electrode 151 and 152.

For example, the first internal electrodes 121 may be connected to only the first external electrode 151, and the second internal electrodes 122 may only be connected to the second external electrode 152. Thus, the first internal electrodes 121 may be spaced apart from the fourth surface 4 by a predetermined distance, and the second internal electrodes 122 may be spaced apart from the third surface 3 by a predetermined distance.

When dielectric layers, on which internal electrodes having a shape described above are formed, are stacked, the first and second internal electrodes 121 and 122, alternately exposed to the third and fourth surfaces 3 and 4, may cause a step portion to be formed in each portion of the body 110, in which only the first or second internal electrode 121 or 122 is formed, in the stacking direction Z.

Figure 5A:
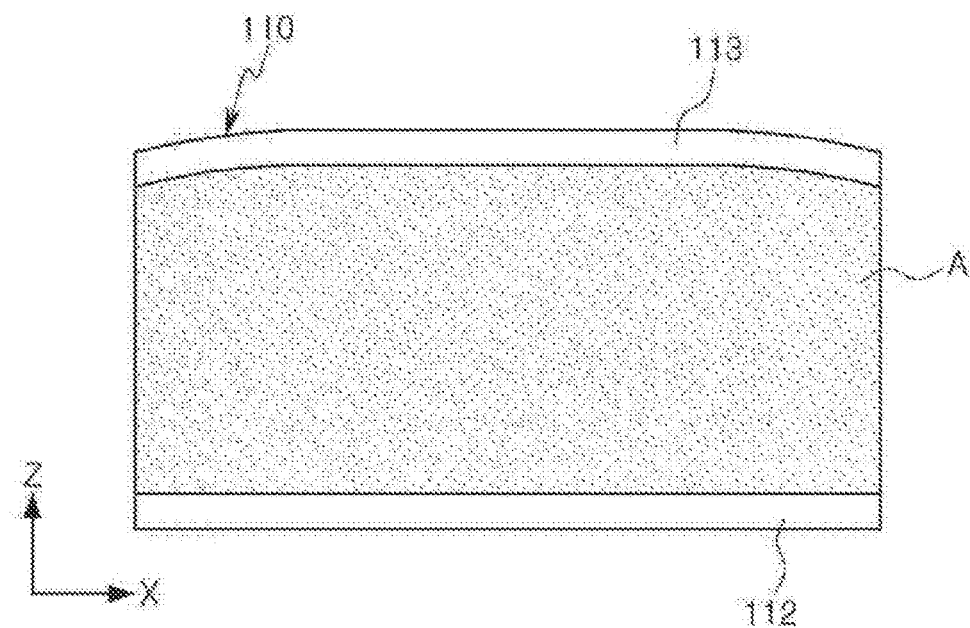
FIG. 5A illustrates a schematic cross-sectional view of an MLCC according to a comparative example.
Figure 5B:
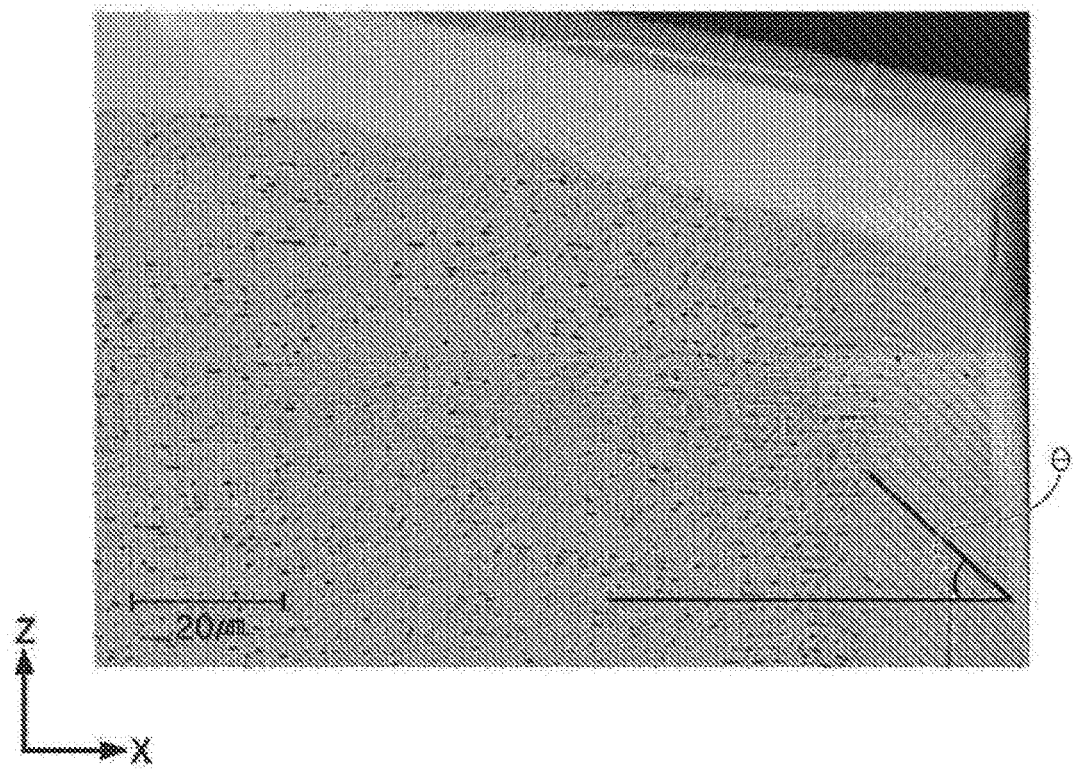
FIG. 5B illustrates an enlarged view of a cross section of an end portion of an MLCC according to a comparative example in a length direction, and depicts a measured deformation angle of an internal electrode.

When tens to hundreds of dielectric layers 111 are stacked, the step portion may cause the dielectric layers 111 to be elongated in each portion of the body 110, in which only the first or second internal electrode 121 or 122 is formed, in the stacking direction Z. The elongation of the dielectric layers may cause the first internal electrodes or the second internal electrodes in each portion of the body, in which only the first or second internal electrode is formed, in the stacking direction, to be bent together, as illustrated in FIGS. 5A and 5B. BDV characteristics may primarily be reduced in a curved portion of the first or second internal electrode illustrated in FIG. 5B.

However, when the spaces between the first internal electrodes 121 and the fourth surface 4 are defined as the first spaces 121', first dielectric patterns 131 may be disposed in the first spaces 121', and when the spaces between the second internal electrodes 122 and the third surface 3 are defined as the second spaces 122', second dielectric patterns 132 may be disposed in the second spaces 122'. Thus, the MLCC 100, according to an exemplary embodiment, may prevent a step portion from being formed in the portion of the body 110, in which only the first or second internal electrode 121 or 122 is formed.

For example, the MLCC 100, according to an exemplary embodiment, may include the first and second dielectric patterns 131 and 132 to prevent the step portion from being formed in the portion of the body 110, in which only the first or second internal electrode 121 or 122 is formed, thus addressing the issue of a reduction in BDV characteristics which may occur in the curved portion of the first or second internal electrode 121 or 122.

Thus, the MLCC 100, according to an exemplary embodiment, may prevent a reduction in BDV characteristics caused by a step portion formed in the width direction by removing the margin portion to form the fifth and sixth surface 5 and 6 and arranging the lateral insulating layers 140 on the fifth and sixth surface 5 or 6, while addressing the issue of a reduction in BDV characteristics caused by a step portion formed in the length direction by preventing the step portion from being formed in the portion of the body 110, in which only the first or second internal electrode 121 or 122 is formed, using the first and second dielectric patterns 131 and 132, thus substantially increasing the overall BDV characteristics of the MLCC 100.

FIG. 5A illustrates a schematic cross-sectional view of an MLCC according to a comparative example, and FIG. 5B illustrates an enlarged view of a cross section of an end portion of an MLCC according to a comparative example in a length direction, and depicts a measured deformation angle of an internal electrode.

Figure 6A:
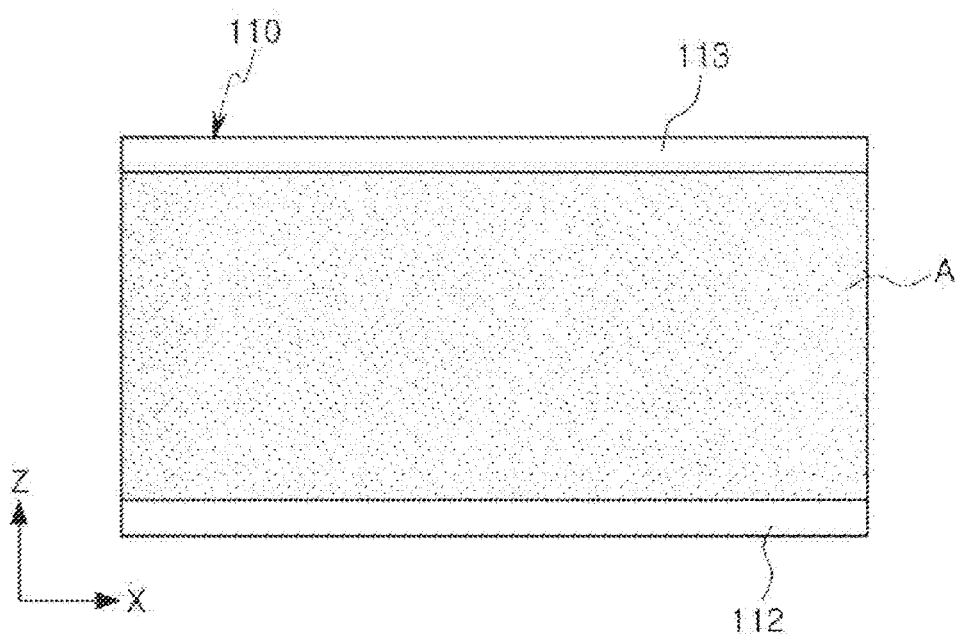
FIG. 6A illustrates a schematic cross-sectional view of an MLCC according to an exemplary embodiment.
Figure 6B:
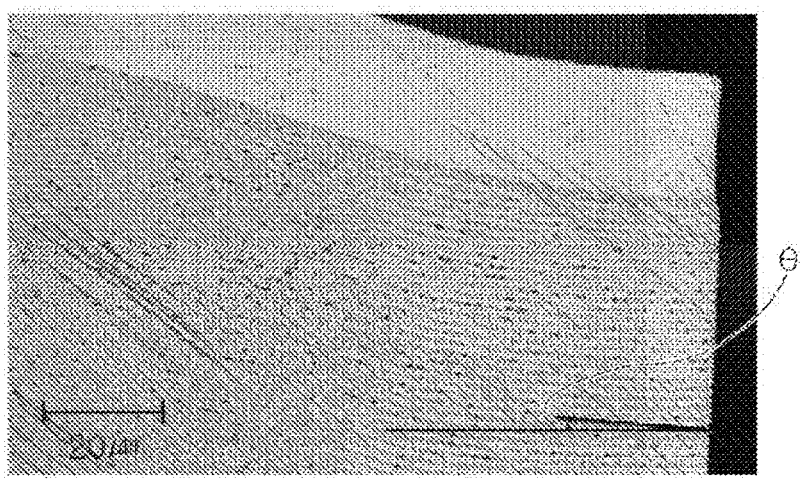
FIG. 6B illustrates an enlarged view of a cross section of an end portion of an MLCC according to an exemplary embodiment in a length direction, and depicts a measured deformation angle of an internal electrode.

FIG. 6A illustrates a schematic cross-sectional view of an MLCC according to an exemplary embodiment, and FIG. 6B illustrates an enlarged view of a cross section of an end portion of an MLCC according to an exemplary embodiment in a length direction, and depicts a measured deformation angle of an internal electrode.

The deformation angles of the internal electrodes, illustrated in FIGS. 5B and 6B, may refer to bent angles of the end portions of the internal electrodes in a length direction X. Referring to FIG. 5B, the deformation angle $\theta$ of the internal electrode of the MLCC according to the comparative example, in which first and second dielectric patterns 131 and 132 are not formed, may range from 25° to 50°. However, referring to FIG. 6B, the MLCC 100 according to an exemplary embodiment, in which the first and second dielectric patterns 131 and 132 are formed in the first and second spaces 121' and 122', respectively, the areas in which the first and second internal electrodes 121 and 122 are not formed, may have a deformation angle $\theta$ of 0° to 15°. Here, the deformation angle refers to the maximum deformation angle among all of the deformation angles of all of the internal electrodes with respect to the length direction X.

Such a deformation angle of the internal electrode may be determined by the content of solids included in a ceramic paste forming the first and second dielectric patterns 131 and 132 and by printing thicknesses of the first and second dielectric patterns 131 and 132. For example, the MLCC 100, according to an exemplary embodiment, may have the first and second dielectric patterns 131 and 132 formed in the first and second spaces 121' and 122', respectively, the spaces in which the first and second internal electrodes 121 and 122 are not formed, to significantly reduce the deformation angle of the internal electrode, as compared to the MLCC in the related art, through reducing a step portion formed by the internal electrode, thus increasing BDV characteristics of the MLCC 100.

Figure 7:
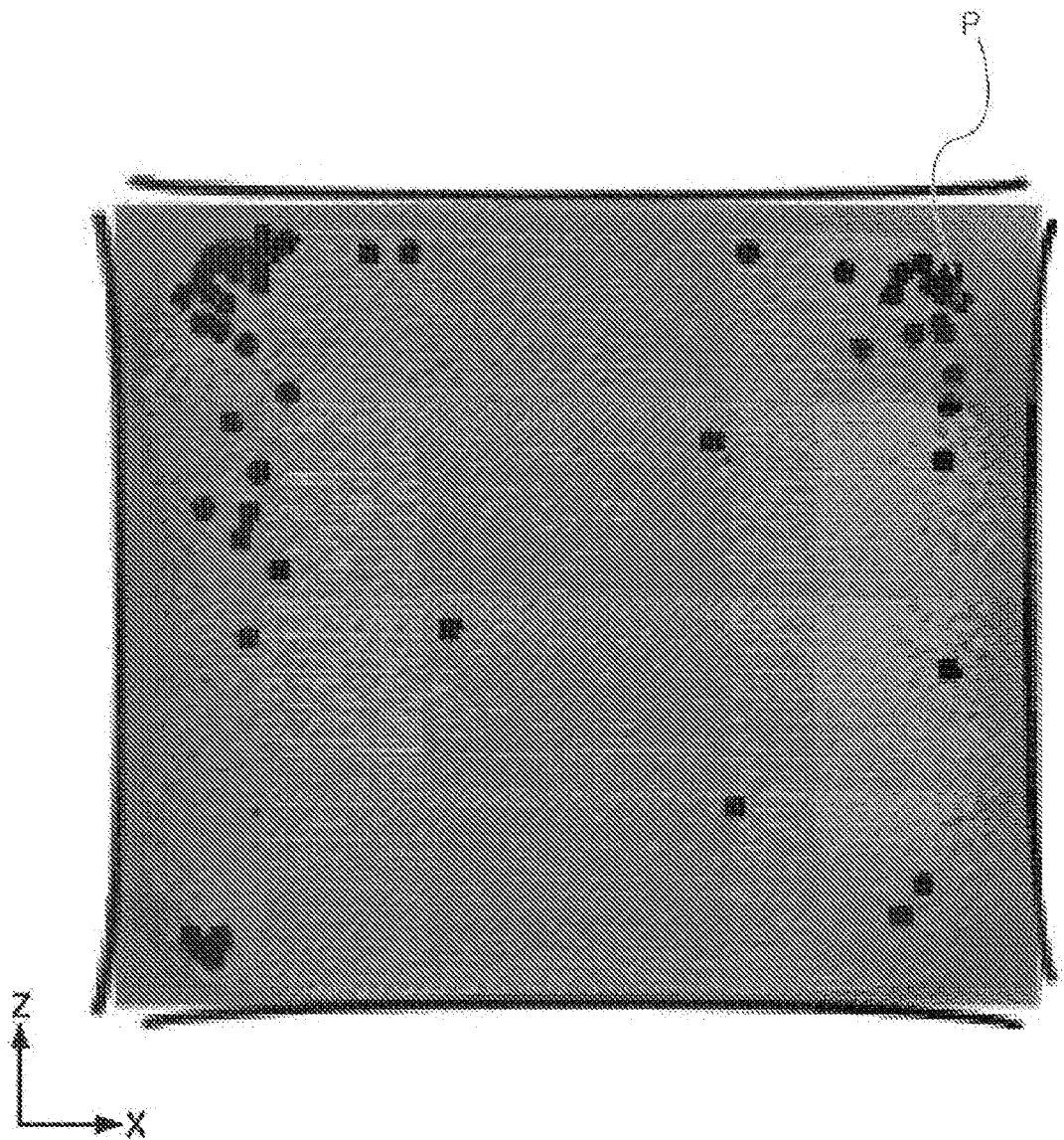
FIG. 7 is an image of a cross section of an MLCC according to a comparative example having a margin portion, and depicts a location P in which breakdown voltage (BDV) characteristics are poor.

The first and second dielectric patterns 131 and 132 may each include a dielectric that may be sintered at a low temperature lower than that for sintering the first and second dielectric layers 111*a* and 111*b*. As illustrated in FIG. 7, a BDV characteristics defect location P may represent that a defect is concentrated at an edge portion of the chip. This shows that the BDV characteristics defect location P is focused on the cover layer or the margin portion having a relatively low level of firing density, except for the upper surface, of the chip, most affected by a step portion. Thus, the first and second dielectric patterns 131 and 132 may be formed of a paste, including a dielectric that may be sintered at the low temperature, to promote sinterability in a location of the MLCC whose sinterability otherwise deteriorates, thus increasing reliability of the MLCC. The dielectric that may be sintered at the low temperature may refer to $BaTiO_3$, including a low-temperature-sintered material. The low-temperature-sintered material may refer to a glass component, including an alkali metal, such as Na or Li. The first and second dielectric patterns 131 and 132 may be made of a material different from that is used to make the first and second dielectric layers 111*b* and 111*a*.

Figure 8A:
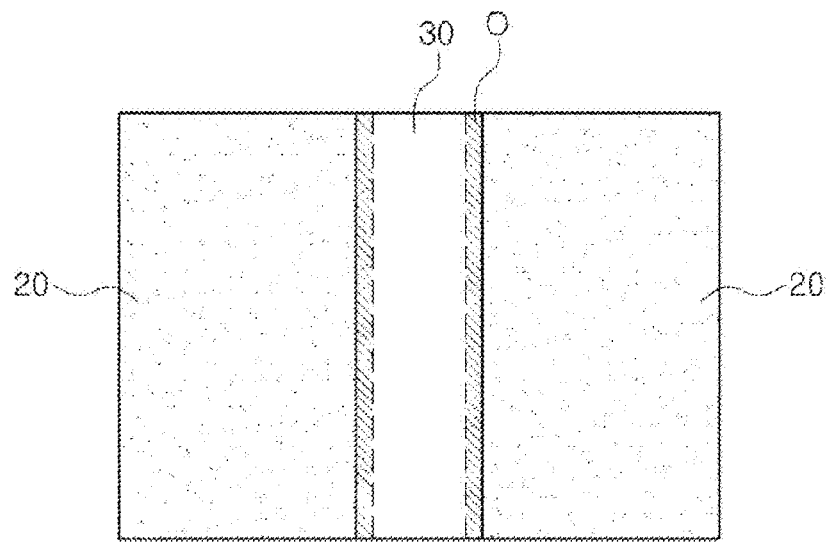
FIGS. 8A and 8B illustrate a gap between an internal electrode and a dielectric pattern disposed on a ceramic sheet, before a stacking process to form a body, during manufacturing an MLCC.
Figure 8B:
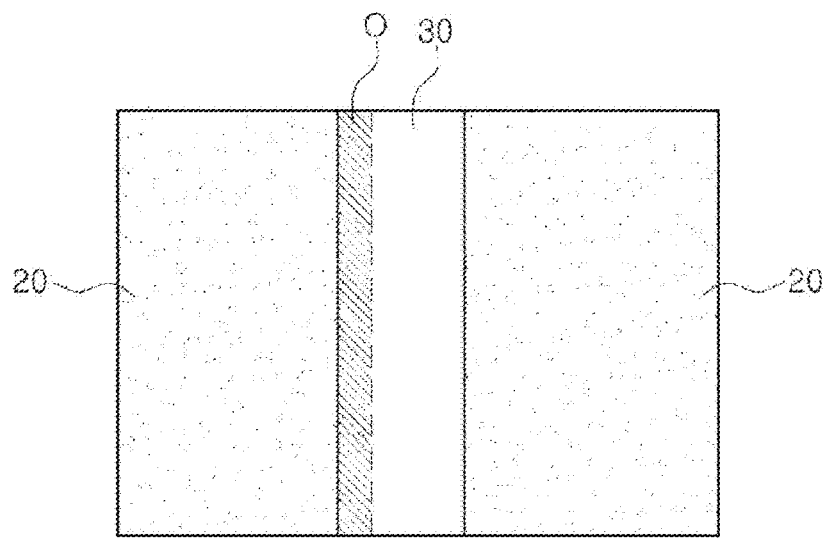
Figure 9A:
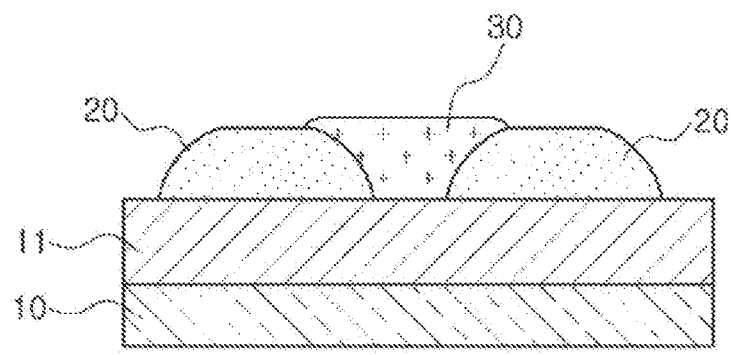
FIGS. 9A and 9B illustrate the shape of an internal electrode and a dielectric pattern printed on a ceramic sheet, before a stacking process to form a body, during manufacturing an MLCC.
Figure 9B:
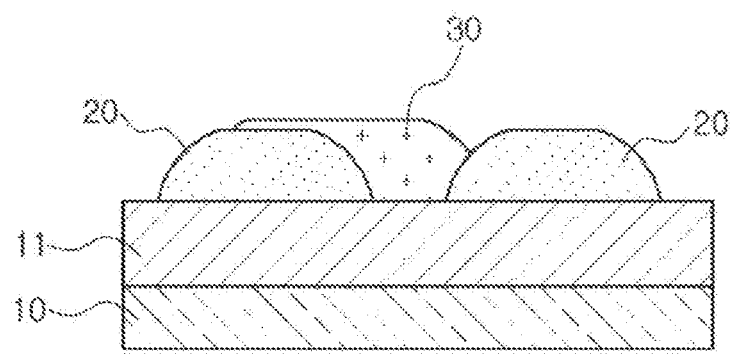

FIGS. 8A and 8B illustrate a gap between an internal electrode 20 and a dielectric pattern 30 disposed on a ceramic sheet, before a stacking process to form a body, during manufacturing an MLCC. FIGS. 9A and 9B illustrate the shape of an internal electrode 20 and a dielectric pattern 30 printed on a ceramic sheet 11, before a stacking process to form a body, during manufacturing an MLCC.

Referring to FIGS. 8A through 9B, forming an internal electrode and a dielectric pattern in the process of manufacturing an MLCC may generally include forming a ceramic sheet 11 on a jig 10, printing internal electrodes 20 on a surface of the ceramic sheet 11, and printing a dielectric pattern 30 between the printed internal electrodes 20 in a length direction X.

In an exemplary embodiment, forming the dielectric pattern 30 precisely in a desired position may be an important factor in reducing a failure rate. Thus, as illustrated in FIG. 8A, the dielectric pattern 30 may be required to be precisely formed between the internal electrodes 20, and when the dielectric pattern 30 is not accurately printed in a target position due to a manufacturing error, the dielectric pattern 30 may be biased toward a side of one of the internal electrodes 20, as illustrated in FIG. 8B. As illustrated in FIG. 8B, when the dielectric pattern 30 is biased toward the one side of the one internal electrode 20 between the internal electrodes 20, the dielectric pattern 30 may not be in contact with the other internal electrode 20. Thus, a step portion problem, caused by the internal electrodes 20, may not be solved.

The dielectric pattern 30 may have an overlap portion O, covering an end portion of the one internal electrode 20, to prevent the dielectric pattern 30 from being biased toward the one side of the one internal electrode 20 between the internal electrodes 20 due to such a manufacturing error. Referring to FIGS. 9A and 9B, the dielectric pattern 30 may cover the end portions of the internal electrodes 20, thus solving the step portion problem caused by the internal electrodes 20, even when precisely formed in a desired position as illustrated in FIG. 9A, as well as even when biased toward the one side of the one internal electrode 20 between the internal electrodes 20 due to such a manufacturing error as illustrated in FIG. 9B. Furthermore, the dielectric pattern 30 may have a thickness increased further than that of the internal electrodes 20, thus preventing the internal electrodes 20 from short-circuiting in the stacking direction due to the slippage of the internal electrodes 20 and the dielectric pattern 30 when pressed. The present disclosure is not limited thereto. Although not shown in the drawings, the dielectric pattern may exactly fill the gap between the internal electrodes and physical contact with the internal electrodes but not overlap with the internal electrodes, or the dielectric pattern may partially fill the gap between the internal electrodes and be spaced apart from the internal electrodes. Such configurations may still suppress the issue caused by the step portion, as compared to an example in which no dielectric pattern is disposed in the gap between the internal electrodes.

Although not shown in the drawings, after stacking a plurality of structures shown in FIGS. 8A-9B, a body 110 may be formed by cutting the stacked structures along a path passing through a central portion of the dielectric pattern 30, such that the third surface 3 or the fourth surface 4 of the body 110 is formed.

Thus, referring back to FIG. 3, the MLCC 100, according to an exemplary embodiment, may have the first dielectric patterns 131 covering end portions of the first internal electrodes 121 and filling the first spaces 121', and the second dielectric patterns 132 covering end portions of the second internal electrodes 122 and filling the second spaces 122'. The first dielectric patterns 131 may cover the end portions of the first internal electrodes 121 and fill the first spaces 121', and the second dielectric patterns 132 may cover the end portions of the second internal electrodes 122 and fill the second spaces 122', to solve a problem that the first and second dielectric patterns 131 and 132 may not properly remove a step portion by being slipped when pressed.

As a result, the MLCC, according to an exemplary embodiment, may have the first and second internal electrodes 121 and 122 exposed to the fifth surface 5 and the sixth surface 6 to solve the step portion problem caused by the margin portion, and may have the first and second dielectric patterns 131 and 132 disposed in the first and second spaces 121' and 122', that is, positions corresponding to the portion of the body 110 in which only the first or second internal electrode 121 or 122 is formed to solve the step portion problem caused by the portion of the body 110.

Thus, the MLCC, according to an exemplary embodiment, may significantly increase BDV characteristics, as compared to an MLCC according to the related art.

Figure 10A:
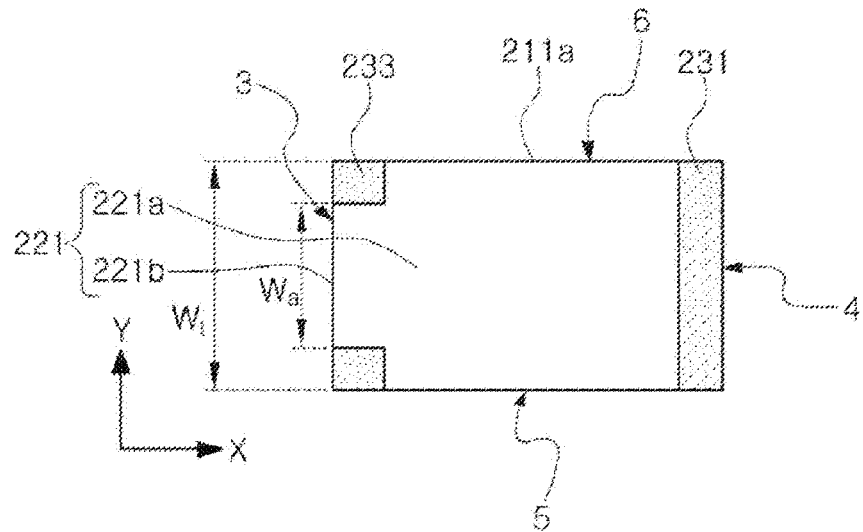
FIGS. 10A and 10B illustrate schematic plan views of a first internal electrode and a second internal electrode of an MLCC according to another exemplary embodiment.
Figure 10B:
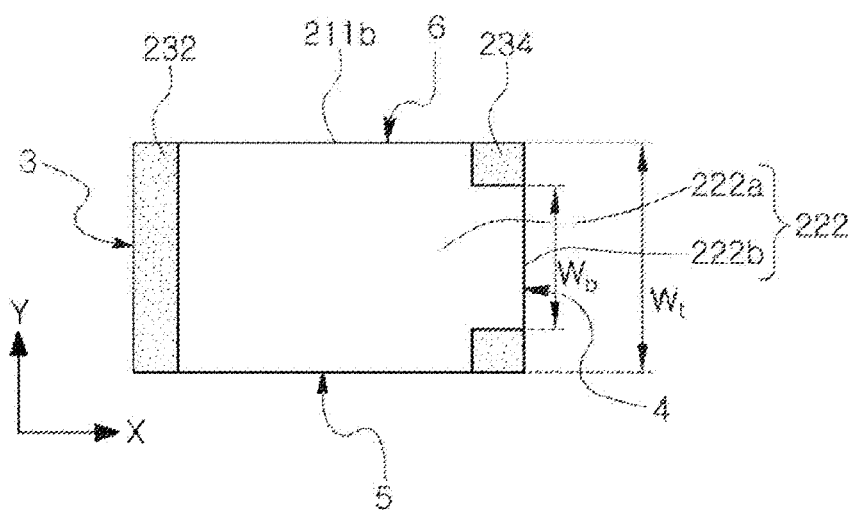

FIGS. 10A and 10B illustrate schematic plan views of a first internal electrode 221 and a second internal electrode 222 of an MLCC according to another exemplary embodiment.

A description of the same configuration as that according to an exemplary embodiment will be omitted.

Referring to FIGS. 10A and 10B, the first internal electrode 221 of the MLCC according to another exemplary embodiment may include a first capacity portion 221a and a first lead portion 221b, and a second internal electrode 222 of the MLCC according to another exemplary embodiment may include a second capacity portion 222a and a second lead portion 222b.

The first and second lead portions 221b and 222b may refer to portions of the first and second internal electrodes 221 and 222, and may each have a width narrower than that of the first and second capacity portions 221a and 222a, and may each be connected to first and second external electrodes.

As mentioned above, when the first and second internal electrodes 221 and 222 are exposed to the fifth surface 5 and the sixth surface 6, short circuits caused by conductive foreign substances or delamination of the cover layer may occur.

In the case of the fifth surface 5 and the sixth surface 6, the lateral insulating layers may be disposed thereon to prevent short circuits caused by conductive foreign substances. However, in the case of the third surface 3 or the fourth surface 4, only a portion of the external electrode may be disposed thereon to cause a reduction in reliability due to conductive foreign substances, such as the infiltration of water into the body.

To solve such a problem, the widths $w_a$ and $w_b$ of the first and second lead portions 221b and 222b may be controlled to 10% to 50% of the width $w_t$ of the first and second capacity portions 221a and 222a.

The following Table 1 illustrates measurements of high-temperature and high-humidity reliability evaluation and equivalent series resistance (ESR).

TABLE 1

| Sample | $w_a/w_t$, $w_b/w_t$ | High-Temperature and High-Humidity Reliability Evaluation | ESR (Mohm) |
| --- | --- | --- | --- |
| 1 | 0 | 4 | 13.2 |
| 2 | 5 | 2 | 12.5 |
| 3 | 10 | 1 | 13.1 |
| 4 | 25 | 0 | 13.3 |
| 5 | 50 | 0 | 13.5 |
| 6 | 60 | 2 | 15.0 |

For the high-temperature and high-humidity reliability evaluation, water absorption reliability according to the ratios $w_a/w_t$ and $w_b/w_t$ of the widths $w_a$ and $w_b$ of the first and second lead portions 221b and 222b to the width $w_t$ of the first and second capacity portions 221a and 222a was measured by measuring levels of resistance of 100 chips over time under high-temperature and high-humidity conditions and calculating the number of chips whose levels of resistance dropped sharply.

Referring to Table 1, when the widths $w_a$ and $w_b$ of the first and second lead portions 221b and 222b are less than 10% of the width $w_t$ of the first and second capacity portions 221a and 222a, the effect of increasing high-temperature and high-humidity reliability may be low. In contrast, when the widths $w_a$ and $w_b$ of the first and second lead portions 221b and 222b are greater than 50% of the width $w_t$ of the first and second capacity portions 221a and 222a, a reduction in contact areas between the external electrodes and the first and second internal electrodes 221 and 222 may cause ESR to increase.

Thus, the MLCC, according to another exemplary embodiment, may allow the widths $w_a$ and $w_b$ of the first and second lead portions 221b and 222b to be controlled to 10% to 50% of the width $w_t$ of the first and second capacity portions 221a and 222a, thus preventing short circuits caused by conductive foreign substances. Alternatively, the MLCC, according to another exemplary embodiment, may allow the widths $w_a$ and $w_b$ of the first and second lead portions 221b and 222b to be controlled to greater than 10% but equal to or less than 50% of the width $w_t$ of the first and second capacity portions 221a and 222a, to significantly increase high-temperature and high-humidity reliability.

When the widths $w_a$ and $w_b$ of the first and second lead portions 221b and 222b are narrower than that of the first and second capacity portions 221a and 222a, areas in which the first and second internal electrodes 221 and 222 are not formed may be generated in first and second dielectric layers 211a and 211b. For example, a step portion may be formed due to a difference between the thicknesses of the first and second internal electrodes 221 and 222 on points on which the first and second lead portions 221b and 222b meet the first and second capacity portions 221a and 222a. For example, the step portion, formed on the points on which the first and second lead portions 221b and 222b meet the first and second capacity portions 221a and 222a, may cause the dielectric layers and the first and second internal electrodes 221 and 222 to be elongated when the dielectric layers are stacked and pressed. Accordingly, BDV characteristics may deteriorate in curved portions of the first and second internal electrodes 221 and 222.

Thus, a third dielectric pattern 233 may be disposed on the point at which the first capacity portion 221a meets the first lead portion 221b, and a fourth dielectric pattern 234 may be disposed on the point at which the second capacity portion 222a meets the second lead portion 222b, solving the step portion problem. For example, the third dielectric pattern 233 may be exposed to the third surface 3, and may be disposed on the point at which the first capacity portion 221a and the first lead portion 221b of the first dielectric layer 211a may be in contact with each other. Further, the fourth dielectric pattern 234 may be exposed to the fourth surface 4, and may be disposed on the point at which the second capacity portion 222a and the second lead portion 222b of the second dielectric layer 211a may be in contact with each other. The third and fourth dielectric patterns 233 and 234 may have the above-mentioned dielectric patterns that may be sintered at the low temperature, thus increasing sinterability of portions of the MLCC corresponding to the third and fourth dielectric patterns 233 and 234.

Further, the MLCC, according to another exemplary embodiment, may include first and second dielectric patterns 231 and 232 as in an exemplary embodiment. The first through fourth dielectric patterns 231 through 234 may be made of the same material used to form the dielectric patterns 131 and 132 and may be different from that is used to make the dielectric layers in the MLCC according to another exemplary embodiment.

Board Having Multilayer Ceramic Capacitor

Figure 11:
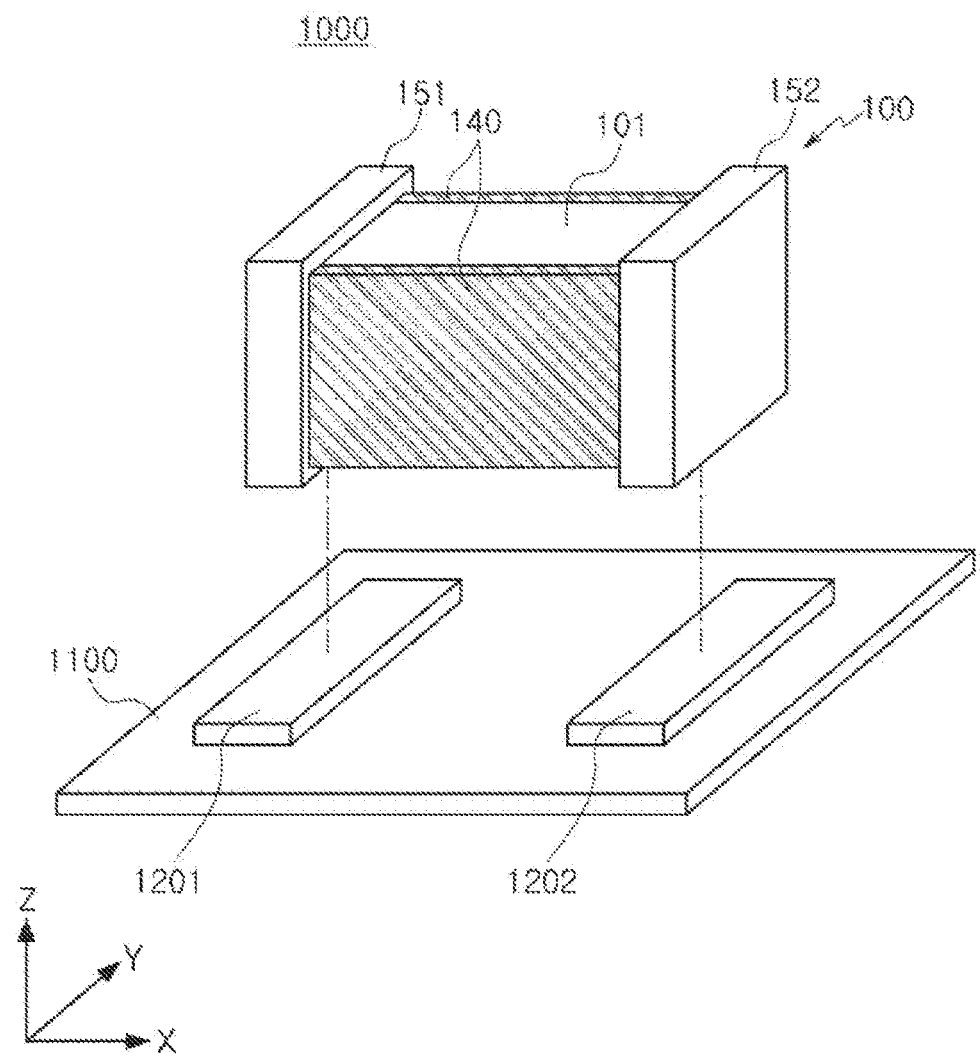
FIG. 11 illustrates a schematic perspective view of a board having an MLCC according to another exemplary embodiment.

FIG. 11 illustrates a schematic perspective view of a board 1000 having an MLCC according to another exemplary embodiment.

Referring to FIG. 11, the board 1000 of the MLCC according to another exemplary embodiment may include a substrate 1100, first and second pads 1201 and 1202, and an MLCC 100.

The substrate 1100 may be a printed circuit board (PCB), but the present disclosure is not limited thereto. The first and second pads 1201 and 1202 may be disposed on a surface of the substrate 1100. The first pad 1201 may be connected to a first external electrode 151, and the second pad 1202 may be connected to a second external electrode 152.

The MLCC 100, mounted on the board 1000 of the MLCC according to another exemplary embodiment, may include the MLCC 100 according to various exemplary embodiments described in the present disclosure.

For example, the MLCC 100, mounted on the board 1000 of the MLCC according to another exemplary embodiment may include: as illustrated in FIGS. 1 through 4, the body 110 including the first and second dielectric layers 111a and 111b, the body including the first surface 1 and the second surface 2 opposing each other in the stacking direction, the third surface 3 and the fourth surface 4 connected to the first surface 1 and the second surface 2 and opposing each other, and the fifth surface 5 and the sixth surface 6 connected to the first to fourth surfaces 1 to 4 and opposing each other; the first internal electrodes 121 disposed on the first dielectric layers 111a, exposed to the third surface 3, the fifth surface 5, and the sixth surface 6, and spaced apart from the fourth surface 4 by the first spaces 121'; the second internal electrodes 122 disposed on the second dielectric layers 111b to oppose the first internal electrodes 121 with the first dielectric layers 111a or the second dielectric layers 111b interposed therebetween, exposed to the fourth surface 4, the fifth surface 5, and the sixth surface 6, and spaced apart from the third surface 3 by the second spaces 122'; the first dielectric patterns 131 disposed in the at least a portion of the first spaces 121', and the second dielectric patterns 132 disposed in the at least a portion of the second spaces 122'; and the lateral insulating layers 140 disposed on the fifth surface 5 and the sixth surface 6 of the body 110. The MLCC 100 may be substituted by an MLCC according to another exemplary embodiment described with reference to FIGS. 10A and 10B.

As set forth above, according to an exemplary embodiment, a multilayer ceramic capacitor (MLCC) may have first and second internal electrodes exposed to a fifth surface and a sixth surface to prevent a step portion from being formed by the first and second internal electrodes on both end surfaces of a body in a width direction, and may include first and second dielectric patterns compensating for step portions formed on both end portions of the first and second internal electrodes in a length direction to prevent a step portion from being formed by the first and second internal electrodes on both end surfaces of the body in a length direction, thus increasing reliability of the MLCC.

While exemplary embodiments have been shown and described above, it will be apparent to those skilled in the art that modifications and variations could be made without departing from the scope of the present disclosure, as defined by the appended claims.

What is claimed is:

1. A multilayer ceramic capacitor (MLCC), comprising:
a body including first dielectric layers and second dielectric layers, the body including a first surface and a second surface opposing each other in a first direction along which the first and second dielectric layers are stacked, a third surface and a fourth surface connected to the first surface and the second surface and opposing each other in a second direction, and a fifth surface and a sixth surface connected to the first surface, the second surface, the third surface, and the fourth surface and opposing each other in a third direction;
first internal electrodes disposed on the first dielectric layers, connected to the third surface, the fifth surface, and the sixth surface, and spaced apart from the fourth surface by first spaces;
second internal electrodes disposed on the second dielectric layers to oppose the first internal electrodes with the first dielectric layers or the second dielectric layers interposed therebetween, connected to the fourth surface, the fifth surface, and the sixth surface, and spaced apart from the third surface by second spaces;
first dielectric patterns disposed in at least portions of the first spaces to contact respective side surfaces of the first internal electrodes, and contacting the fourth surface;
second dielectric patterns disposed in at least portions of the second spaces to contact respective side surfaces of the second internal electrodes, and contacting the third surface;
lateral insulating layers disposed on the fifth surface and the sixth surface of the body; and
a first external electrode and a second external electrode disposed on the third surface and the fourth surface and connected to the first internal electrodes and the second internal electrodes, respectively,
wherein a deformation angle of the first internal electrodes is 15° or lower, the deformation angle being an angle of each portion of the first internal electrodes exposed to the third surface inclined with respect to the second surface, a thickness, in the first direction, of a central portion of one of the first dielectric patterns in the second direction is greater than a thickness, in the first direction, of a central portion of one of the first internal electrodes in the second direction, and a thickness, in the first direction, of a central portion of one of the second dielectric patterns in the second direction is greater than a thickness, in the first direction, of a central portion of one of the second internal electrodes in the second direction.

2. The MLCC of claim 1, wherein the first dielectric patterns overlap end portions of the first internal electrodes in the stacking direction and fill the first spaces, respectively, and the second dielectric patterns overlap end portions of the second internal electrodes in the stacking direction and fill the second spaces, respectively.

3. The MLCC of claim 1, wherein the first and second dielectric patterns are composed of a material different from a material of the first and second dielectric layers.

4. The MLCC of claim 1, the first and second dielectric patterns include a dielectric that includes a glass component including an alkali metal.

5. The MLCC of claim 1, wherein each of the first internal electrodes includes a first capacity portion and a first lead portion connecting the first capacity portion to a first external electrode while having a width narrower than a width of the first capacity portion.

6. The MLCC of claim 5, wherein a ratio of the width of the first lead portion to the width of the first capacity portion is 10% to 50%.

7. The MLCC of claim 5, further comprising third dielectric patterns disposed on portions of the first dielectric layers in which the first capacity portion is in contact with the first lead portion.

8. The MLCC of claim 7, wherein the third dielectric patterns include a dielectric that includes a glass component including an alkali metal.

9. The MLCC of claim 1, wherein the lateral insulating layers include a polymer or a ceramic.

10. The MLCC of claim 1, wherein the lateral insulating layers include a dielectric.

11. A multilayer ceramic capacitor (MLCC), comprising:
a body including first dielectric layers and second dielectric layers, the body including a first surface and a second surface opposing each other in a stacking direction along which the first and second dielectric layers are stacked, a third surface and a fourth surface connected to the first surface and the second surface and opposing each other, and a fifth surface and a sixth surface connected to the first surface, the second surface, the third surface, and the fourth surface and opposing each other;

first internal electrodes disposed on the first dielectric layers, connected to the third surface, the fifth surface, and the sixth surface, and spaced apart from the fourth surface by first spaces;

second internal electrodes disposed on the second dielectric layers to oppose the first internal electrodes with the first dielectric layers or the second dielectric layers interposed therebetween, connected to the fourth surface, the fifth surface, and the sixth surface, and spaced apart from the third surface by second spaces;

first dielectric patterns disposed in at least portions of the first spaces to contact respective side surfaces of the first internal electrodes, and contacting the fourth surface;

second dielectric patterns disposed in at least portions of the second spaces to contact respective side surfaces of the second internal electrodes, and contacting the third surface;

lateral insulating layers disposed on the fifth surface and the sixth surface of the body; and a first external electrode and a second external electrode disposed on the third surface and the fourth surface and connected to the first internal electrodes and the second internal electrodes, respectively, wherein the first internal electrodes each include a first capacity portion and a first lead portion connecting the first capacity portion to the first external electrode while having a width narrower than a width of the first capacity portion, the second internal electrodes each include a second capacity portion and a second lead portion connecting the second capacity portion to the second external electrode while having a width narrower than a width of the second capacity portion, a ratio of the width of the first lead portion to the width of the first capacity portion is 10% to 50%, a ratio of the width of the second lead portion to the width of the second capacity portion is 10% to 50%, a distance, in the stacking direction, between substantially parallel surfaces of a portion of one of the first dielectric patterns is greater than a distance, in the stacking direction, between substantially parallel surfaces of a portion of one of the first internal electrodes, and a distance, in the stacking direction, between substantially parallel surfaces of a portion of one of the second dielectric patterns is greater than a distance, in the stacking direction, between substantially parallel surfaces of a portion of one of the second internal electrodes.

12. The MLCC of claim 11, wherein the first dielectric patterns overlap end portions of the first internal electrodes in the stacking direction and fill the first spaces, respectively, and the second dielectric patterns overlap end portions of the second internal electrodes in the stacking direction and fill the second spaces, respectively.

13. The MLCC of claim 11, wherein the first and second dielectric patterns are composed of a material different from a material of the first and second dielectric layers.

14. The MLCC of claim 11, the first and second dielectric patterns include a dielectric that includes a glass component including an alkali metal.

15. The MLCC of claim 11, further comprising third dielectric patterns disposed on portions of the first dielectric layers in which the first capacity portion is in contact with the first lead portion.

16. The MLCC of claim 15, wherein the third dielectric patterns include a dielectric that includes a glass component including an alkali metal.

17. The MLCC of claim 11, wherein the lateral insulating layers include a polymer or a ceramic.

18. The MLCC of claim 12, wherein the lateral insulating layers include a dielectric.

* * * * *